(12) United States Patent
Ito

(10) Patent No.: US 9,184,287 B2
(45) Date of Patent: Nov. 10, 2015

(54) NATIVE PMOS DEVICE WITH LOW THRESHOLD VOLTAGE AND HIGH DRIVE CURRENT AND METHOD OF FABRICATING THE SAME

(71) Applicant: Broadcom Corporation, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/741,157

(22) Filed: Jan. 14, 2013

(65) Prior Publication Data

US 2014/0197497 A1 Jul. 17, 2014

(51) Int. Cl.
| | |
|---|---|
| *H01L 29/78* | (2006.01) |
| *H01L 21/8234* | (2006.01) |
| *H01L 21/28* | (2006.01) |
| *H01L 29/06* | (2006.01) |
| *H01L 29/10* | (2006.01) |
| *H01L 21/8238* | (2006.01) |
| *H01L 29/49* | (2006.01) |
| *H01L 29/66* | (2006.01) |
| *H01L 21/762* | (2006.01) |

(52) U.S. Cl.
CPC ...... *H01L 29/7833* (2013.01); *H01L 21/28123* (2013.01); *H01L 21/823456* (2013.01); *H01L 21/823807* (2013.01); *H01L 21/823814* (2013.01); *H01L 21/823892* (2013.01); *H01L 29/0692* (2013.01); *H01L 29/1083* (2013.01); *H01L 29/6659* (2013.01); *H01L 29/7848* (2013.01); *H01L 21/76224* (2013.01); *H01L 29/4958* (2013.01); *H01L 29/66545* (2013.01); *H01L 29/66628* (2013.01)

(58) Field of Classification Search
CPC ............ H01L 29/6659; H01L 29/7833; H01L 29/7848
USPC .............................................. 257/18, E29.193
See application file for complete search history.

(56) References Cited

U.S. PATENT DOCUMENTS

| | | | |
|---|---|---|---|
| 6,114,729 | A | 9/2000 | Park et al. |
| 6,118,158 | A | 9/2000 | Kim |
| 6,514,810 | B1 | 2/2003 | Kim et al. |

(Continued)

OTHER PUBLICATIONS

DeGraeve er al., "Relation Between Breakdown Mode and Location in Short-Chennel nMOSFETs and Its Impact on Reliability Specifications," *IEEE Transactions on Device and Materials Reliability*, vol. 1, No. 3, Sep. 2001, pp. 163-169.

*Primary Examiner* — Amar Movva
(74) *Attorney, Agent, or Firm* — Sterne, Kessler, Goldstein & Fox P.L.L.C.

(57) ABSTRACT

A native p-type metal oxide semiconductor (PMOS) device that exhibits a low threshold voltage and a high drive current over a varying range of short channel lengths and a method for fabricating the same is discussed in the present disclosure. The source and drain regions of the native PMOS device, each include a strained region, a heavily doped raised region, and a lightly doped region. The gate region includes a stacked layer of a gate oxide having a high-k dielectric material, a metal, and a contact metal. The high drive current of the native PMOS device is primarily influenced by the increased carrier mobility due to the strained regions, the lower drain resistance due to the raised regions, and the higher gate capacitance due to the high-k gate oxide of the native PMOS device.

23 Claims, 12 Drawing Sheets

(56) References Cited

U.S. PATENT DOCUMENTS

| | | |
|---|---|---|
| 6,700,176 B2 | 3/2004 | Ito et al. |
| 6,875,650 B2 | 4/2005 | Salling et al. |
| 6,902,958 B2 | 6/2005 | Ito et al. |
| 6,985,387 B2 | 1/2006 | Chen et al. |
| 7,161,213 B2 | 1/2007 | Ito et al. |
| 7,382,024 B2 | 6/2008 | Ito et al. |
| 2008/0079033 A1* | 4/2008 | Waite et al. .................... 257/255 |
| 2011/0049643 A1* | 3/2011 | Matsuoka ..................... 257/408 |

* cited by examiner

NATIVE PMOS DEVICE WITH LOW THRESHOLD VOLTAGE AND HIGH DRIVE CURRENT AND METHOD OF FABRICATING THE SAME

BACKGROUND OF THE DISCLOSURE

1. Field of the Disclosure

The present disclosure generally relates to semiconductor devices, and more specifically to native p-type metal oxide silicon (PMOS) devices having low threshold voltage and high drive current.

2. Background Art

Metal oxide semiconductor field effect transistor (MOSFET) devices are generally fabricated using conventional complementary metal oxide silicon (CMOS) foundry technology. The conventional CMOS logic foundry technology accommodates a minimum size, such as a length, width, and/or height of the regions of the semiconductor devices as defined by one or more minimum design rules (MDRs). These minimum design rules represent limits to resolution of processing used by the conventional CMOS logic foundry technology, such a minimum space interval between one or more photolithographic masks used to manufacture the semiconductor devices.

A conventional MOSFET device generally includes a source region, a drain region, a gate between the source and drain regions, and a channel region below the gate region. A minimum voltage, called the threshold voltage, is required at the gate for the device to turn "on". A drive current, also referred to as a drain current, flows between the source and drain regions through the channel region when a gate potential above the threshold voltage is applied, and potentials at the source and drain regions are applied. MOSFET devices can be fabricated to be P-type or N-type devices. A P-type metal oxide semiconductor field effect transistor (PMOSFET) device, for example, can be fabricated by implanting phosphorus atoms into a P-type substrate to create an N-well. P+ regions are formed in the N-well to provide source and drain regions. A PMOSFET device may be interchangeably referred to herein as PMOS device or PMOSFET device.

With the advance in semiconductor technology and the increasing need for high speed systems with low power consumption, there has been continued scaling down of MOSFET devices using CMOS foundry technology with decreasing MDRs to accommodate a larger number of MOSFET devices on smaller systems. However, the scaling down of MOSFET devices to smaller dimensions can introduce short channel effects in the devices due to the short channel lengths (about approximately 100 nm or less) of the scaled down MOSFET devices. Short channel effects can cause degradation in the performance of the MOSFET device due to, for example, but not limited to the loss of gate control over the threshold voltage which can result in the device being mostly in the "on" state and the degradation of carrier mobility which results in lower drive current.

The foregoing problem with the threshold voltage has been addressed in U.S. patent application Ser. No. 10/911,720, filed on Aug. 5, 2004, now U.S. Pat. No. 7,161,213 and U.S. patent application Ser. No. 11/648,651, filed on Jan. 3, 2007, now U.S. Pat. No. 7,382,024, all of which are incorporated herein by reference in their entirety. In the aforementioned applications, a conventional native PMOS device having a low threshold voltage has been described. The conventional native PMSO device includes a P+ polysilicon gate, halo implants, lightly doped regions in the source and drain regions, and heavily doped regions in the source and drain regions. The halo implants and the doped regions of the source and drain regions primarily enable low threshold voltage characteristics of the conventional native PMOS device.

With the continued scaling down of MOSFET devices, there is still an ongoing need for a MOSFET device that maintains a stable threshold voltage and exhibits a high drive current over a varying range of short channel lengths. At the same time, for a MOSFET device to have a large operating voltage range, it is necessary for the threshold voltage to be close to zero volts.

BRIEF DESCRIPTION OF THE DRAWINGS/FIGURES

The accompanying drawings illustrate the present disclosure and, together with the description, further serve to explain the principles of the disclosure and to enable one skilled in the pertinent art to make and use the disclosure.

Figure 9:
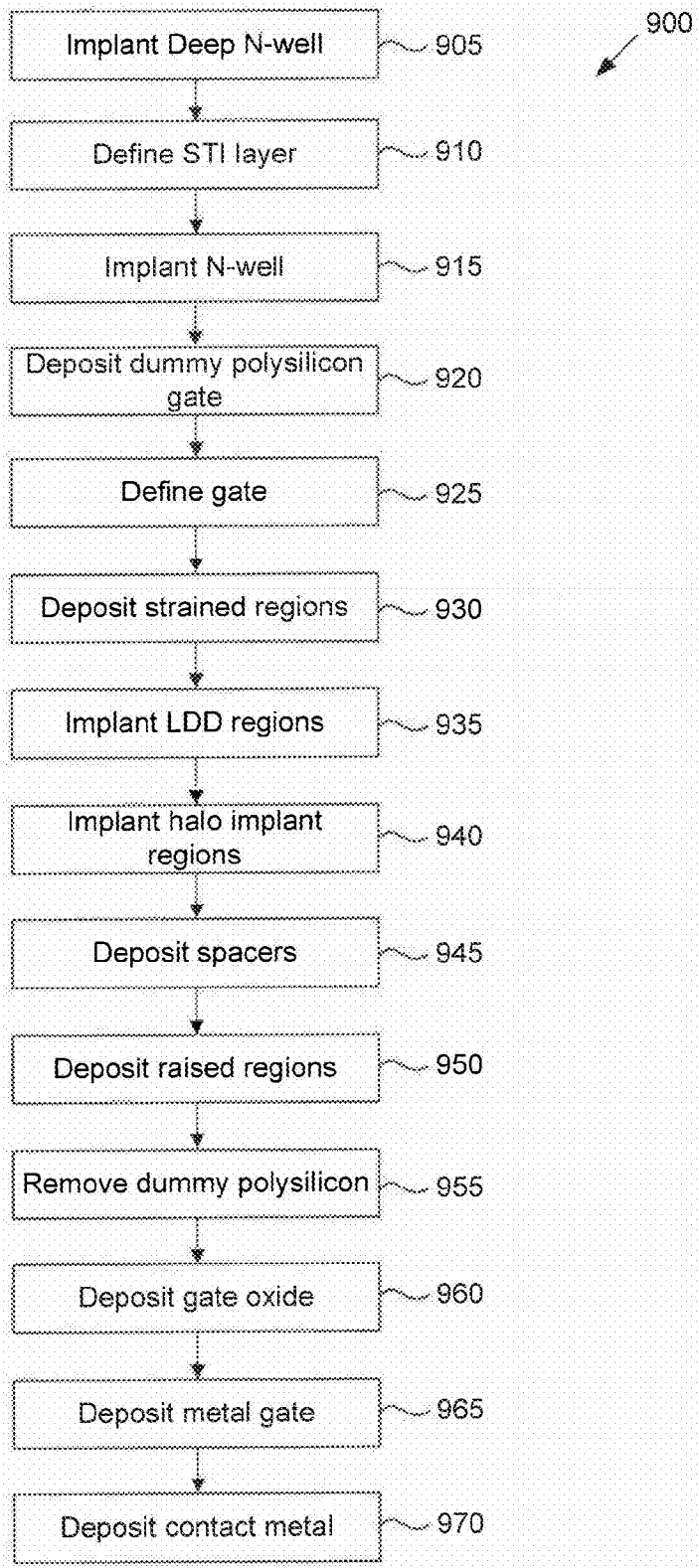

FIG. 9 further illustrates a flow chart for a method of processing a native PMOS device according to a second embodiment of the present disclosure.

Figure 10:
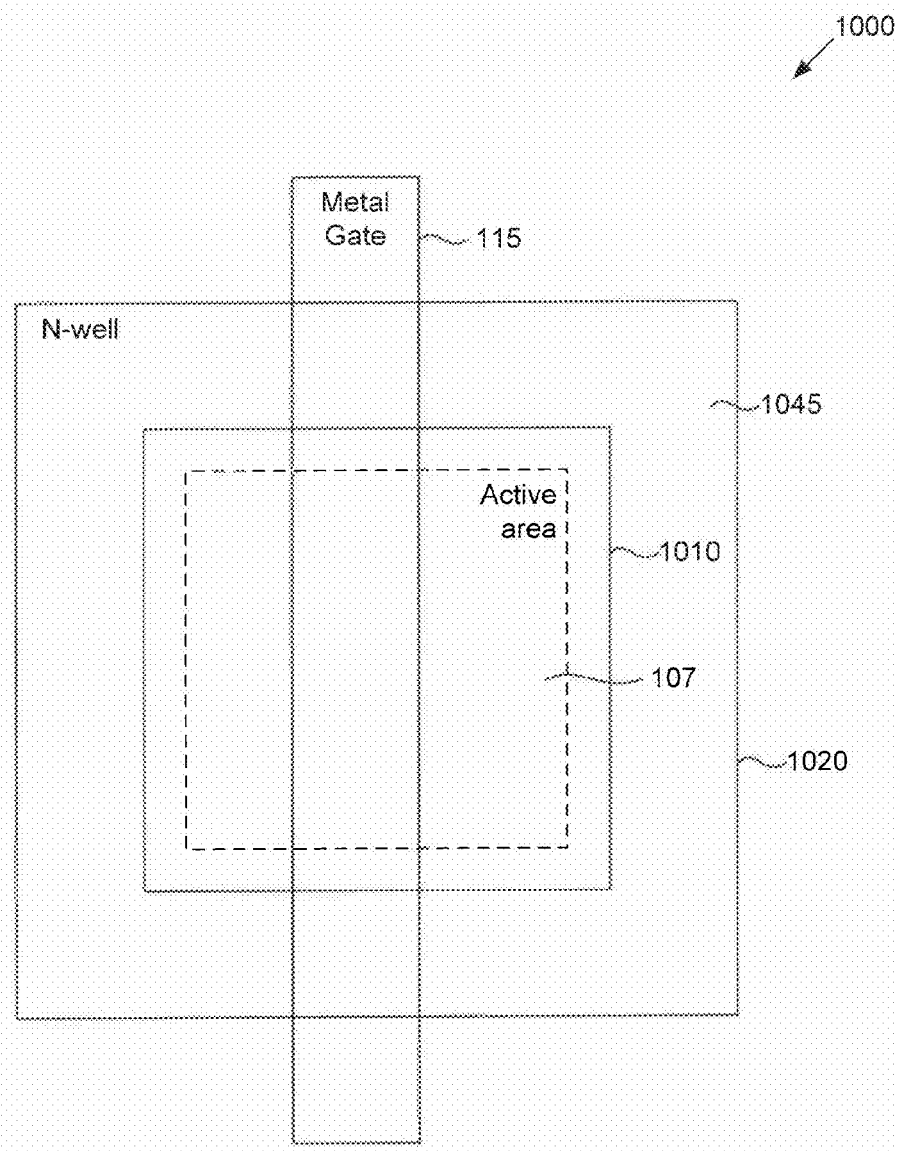

FIG. 10 illustrates a first exemplary configuration of a native PMOS device according to an embodiment of the present disclosure.

Figure 11:
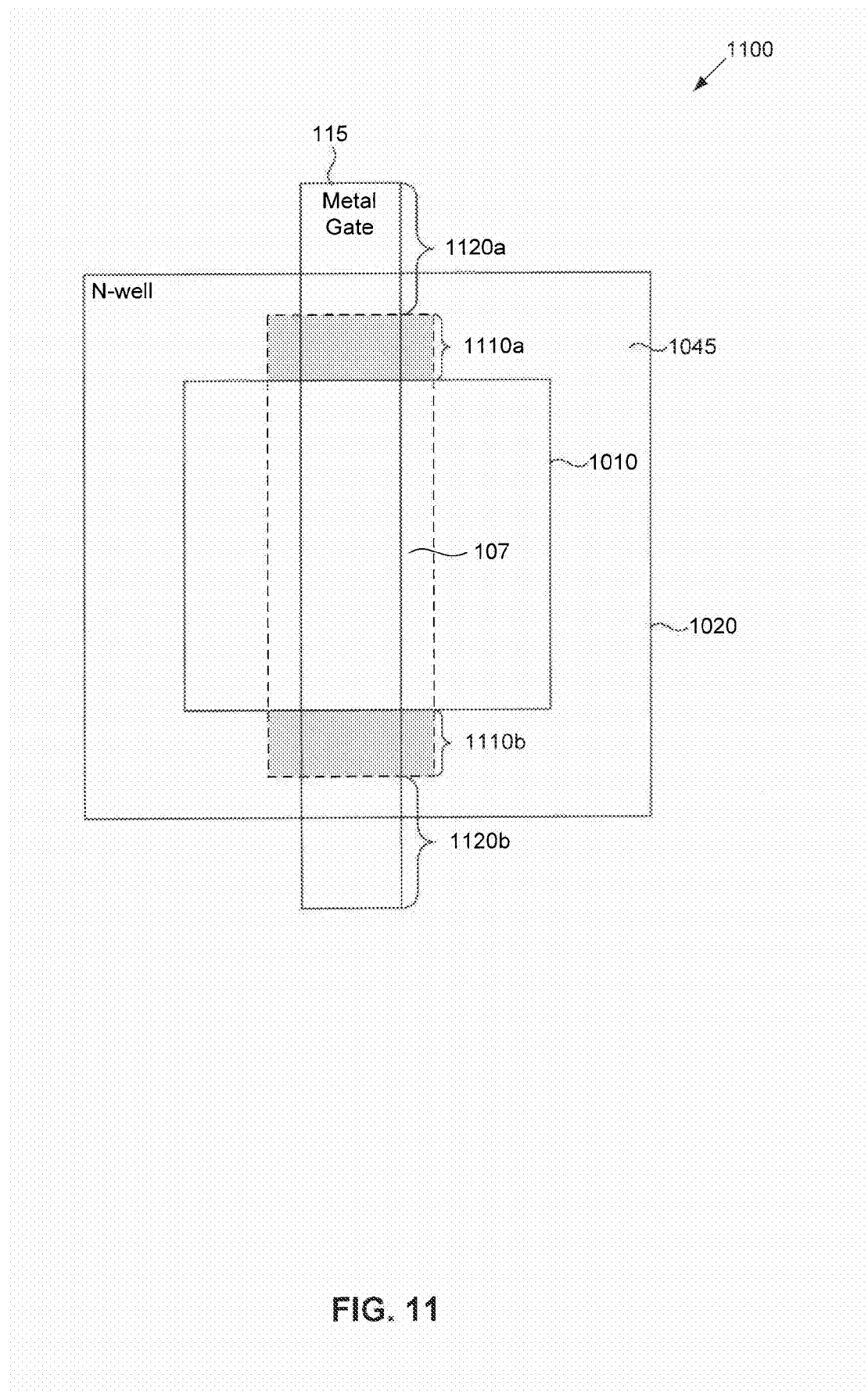

FIG. 11 illustrates a second exemplary configuration of a native PMOS device according to an embodiment of the present disclosure.

Figure 12:
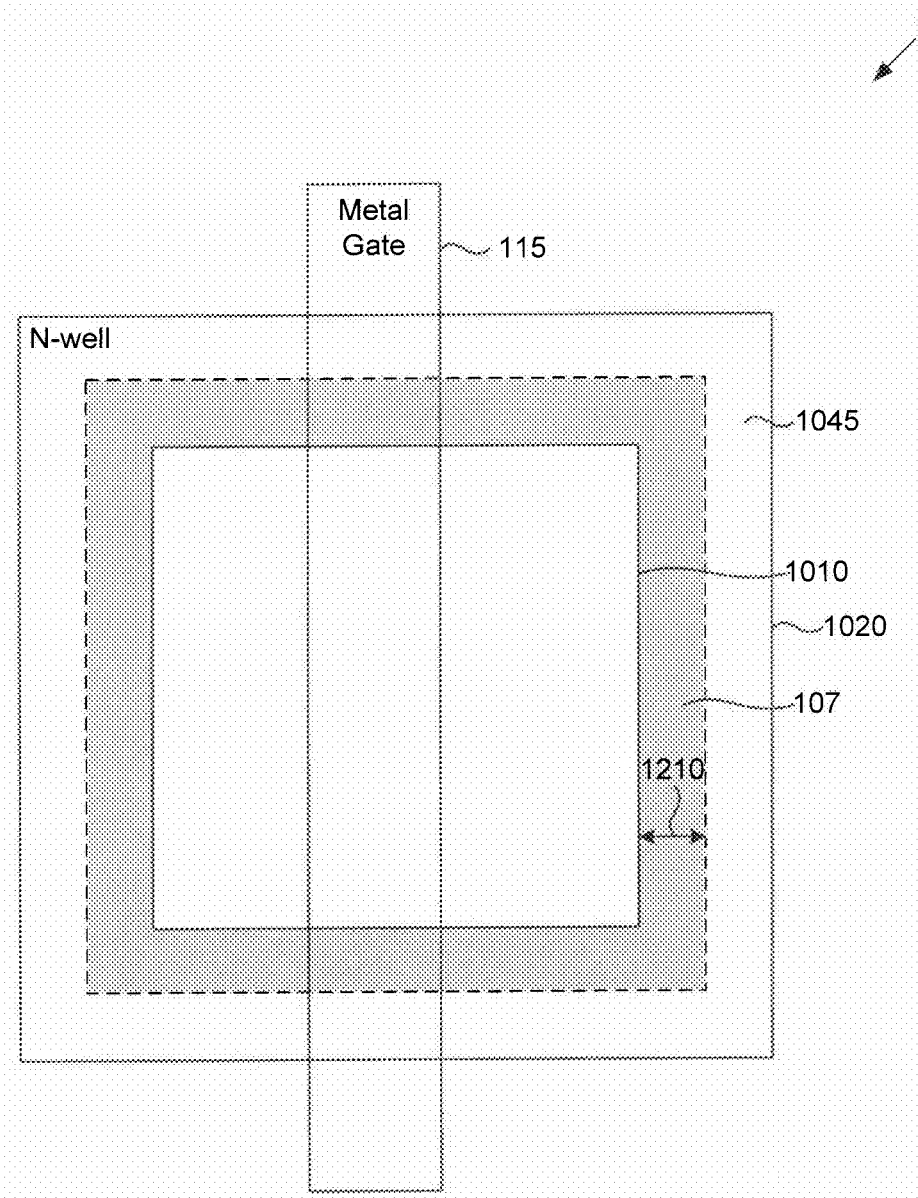

FIG. 12 illustrates a third exemplary configuration of a native PMOS device according to an embodiment of the present disclosure.

The present disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

The following Detailed Description refers to accompanying drawings to illustrate exemplary embodiments consistent with the present disclosure. References in the Detailed Description to "one exemplary embodiment," "an exemplary embodiment," "an example exemplary embodiment," etc., indicate that the exemplary embodiment described can include a particular feature, device, or characteristic, but every exemplary embodiment can not necessarily include the particular feature, device, or characteristic. Moreover, such phrases are not necessarily referring to the same exemplary embodiment. Further, when a particular feature, device, or characteristic is described in connection with an exemplary embodiment, it is within the knowledge of those skilled in the relevant art(s) to effect such feature, device, or characteristic in connection with other exemplary embodiments whether or not explicitly described. Furthermore, it should be understood that spatial descriptions (e.g., "above," "below," "up," "left," "right," "down," "top," "bottom," "vertical," "horizontal," etc.) used herein are for purposes of illustration oily, and that practical implementations of the devices described herein can be spatially arranged in any orientation or manner.

The exemplary embodiments described herein are provided for illustrative purposes, and are not limiting. Other exemplary embodiments are possible, and modifications can be made to the exemplary embodiments within the spirit and scope of the present disclosure. Therefore, the Detailed Description is not meant to limit the present disclosure. Rather, the scope of the present disclosure is defined only in accordance with the following claims and their equivalents.

The following Detailed Description of the exemplary embodiments will so fully reveal the general nature of the present disclosure that others can, by applying knowledge of those skilled in relevant art(s), readily modify and/or adapt for various applications such exemplary embodiments, without undue experimentation, without departing from the spirit and scope of the present disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

The example embodiments described herein are provided for illustrative purposes, and are not limiting. Further structural and operational embodiments, including modifications/alterations, will become apparent to persons skilled in the relevant art(s) from the teachings herein.

Embodiments of native PMOS devices of the present disclosure are processed using smaller CMOS logic foundry technologies than that used for processing the conventional native PMOS. These embodiments of the present disclosure are characterized as having higher drive current (also referred herein as drain current) when compared to the drive current of the conventional native PMOS while maintaining a low threshold voltage similar to the threshold voltage of the conventional native PMOS.

A Native PMOS According to a First Embodiment of the Present Disclosure

Figure 1:
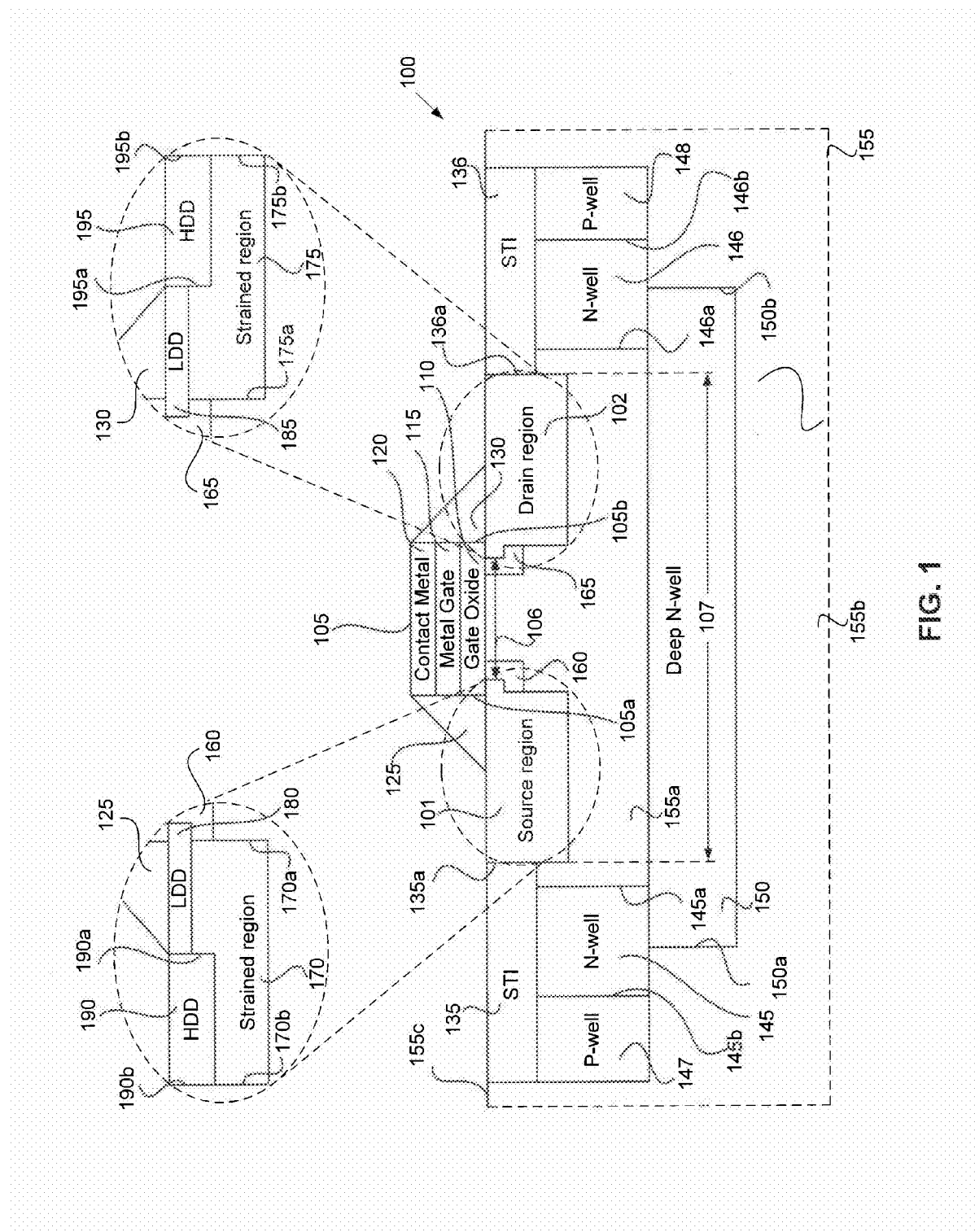
FIG. 1 illustrates a cross-sectional view of a native P-type metal oxide semiconductor (PMOS) device according to a first embodiment of the present disclosure.

FIG. 1 illustrates a cross-sectional view of a native PMOS device 100 according to a first embodiment of the present disclosure. The native PMOS device 100 includes a substrate 155, a deep N-well 150, N-wells 145 and 146, P-wells 147 and 148, shallow trench isolation (STI) regions 135 and 136, a source region 101, a drain region 102, a gate region 105, a channel region 106, spacers 125 and 130, halo implants 160 and 165, and strained regions 170 and 175.

The substrate 155 can be a silicon (Si) substrate on which the native PMOS device 100 can be formed. The substrate 155 can be implanted with p-type carriers to be a P-type Si substrate. The p-type carriers are provided by p-type materials, such as, but not limited to, boron or aluminum to provide some examples. The deep N-well 150 can be positioned to divide the substrate 155 laterally into substrate regions 155a and 155b, with the region 155a between and in substantial contact with the gate region 105 and the deep N-well 150.

The deep N-well 150 can be formed by doping the substrate with n-type carriers using n-type materials, such as, but not limited to phosphorus, arsenic, or antimony to provide some examples. In an example of the first embodiment, the deep N-well 150 can be positioned at least between approximately 0.3 and approximately 0.5 µm below a top side 155c of the substrate 155 to prevent a "tail" of a Gaussian carrier distribution in the deep N-well 150 from substantially effecting a carrier concentration of the substrate region 155a. For example, n-type carriers from the deep N-well 150 can form a heavily doped N-well in the substrate region 155a if the deep N-well is positioned less than approximately 0.3 µm below the top side 155c. This heavily doped N-well may result in a large threshold voltage of the native PMOS device 100. In an example of this embodiment, the substrate region 155a can be a lightly doped n-type region.

Generally, doping a material with a comparatively small doping concentration of carriers, approximately $10^{16}$ to $10^{18}$/$cm^3$ refers to a doping that is low or light. Similarly, doping a material with a comparatively large doping concentration of carriers equal or greater than $10^{19}$/$cm^3$, refers to a doping that is high or heavy.

In one example of this embodiment, the deep N-well 150 can extend laterally beyond the inner perimeter sides 145a and 146b of the respective N-wells 145 and 146, such that a first side 150a and a second side 150b of the deep N-well 150 is positioned between the inner perimeter sides 145a and 146a and the outer perimeter sides 145b and 146b of the N-wells 145 and 146, respectively. In another example of this embodiment, the deep N-well 150 can extend laterally beyond the outer perimeter sides 145b and 146b of the N-wells 145 and 146, such that the deep N-well 150 serves as a common deep N-well for several other devices formed on the substrate 155.

The N-wells 145 and 146 can be formed, for example, by doping the substrate 155 with n-type carriers. The n-type material used for doping the N-wells 145 and 146 can be similar to or different than the n-type material used for the deep N-well 150. In an example of the first embodiment, the N-wells 145 and 146 can be doped more heavily than the deep N-well 150. The vertical dimension of the N-wells 145 and 146 can be smaller than the vertical dimension of the deep N-well 150, according to an example of the first embodiment. Although the N-wells 145 and 146 are depicted as two separate N-wells in the cross-sectional view of the device 100 in FIG. 1, the N-wells 145 and 146 can represent a single, concentric N-well with a continuous inner perimeter side and a continuous outer perimeter side (not shown). The device 100 can include any suitable number of N-wells, for example.

The native PMOS device 100 can be a part of a complementary metal oxide semiconductor (CMOS) device. In a CMOS device, PMOS and N-type metal oxide semiconductor (NMOS) devices are electrically coupled, such that the combination of PMOS and NMOS devices typically use less power than PMOS or NMOS devices operating independently. Both the deep N-well 150 and the N-wells 145 and 146 can provide isolation for the native PMOS device 100 from an adjacent NMOS device (not shown). For example, the deep N-well 150 and/or the N-wells 145 and 146 can prevent or hinder any parasitic effects between the PMOS device 100 and any adjacent devices fabricated on the substrate 155. Atoms in the deep N-well 150 and/or the N-wells 145 and 146 can form bonds with carriers as the carriers migrate from one device toward another. In addition, the deep N-well 150 can electrically isolate the substrate regions 155a and 155b from each other. For instance, the deep N-well 150 can provide electrical isolation in the vertical direction with respect to the two-dimensional representation of the native PMOS device 100 in FIG. 1.

STI regions 135 and 136 can provide isolation and protection for the native PMOS device 100. For instance, the STI region 135 can provide isolation in the lateral direction with respect to the two-dimensional representation of the native PMOS device 100 in FIG. 1. The STI regions 135 and 136 can be formed of a dielectric material (e.g., $SiO_2$), though any suitable insulating material can be used. For instance, bipolar technologies sometimes use polysilicon, rather than $SiO_2$. Although the STI regions 135 and 136 are depicted as two separate STI regions in the cross-sectional view of the device 100 in FIG. 1, the STI regions 135 and 136 can represent a single, concentric STI region with a continuous inner perimeter side and a continuous outer perimeter side (not shown), according to an example of this embodiment. In another example of this embodiment, the STI regions 135 and 136 can be two separate regions.

The source region 101 of the native PMOS device 100 can be formed to include a strained region 170, an LDD (lightly doped drain) region 180, and an HDD (heavily doped drain) region 190. The drain region 102 can be formed to include a strained region 175, an LDD region 185, and an HDD region 195. The region between the outer edges of the source region 101 and the drain region 102 of the device 100 is commonly referred to as an active region 107. More specifically, the region between a second side 190b of the HDD region 190 and a second side 195b of the HDD region 195 is the active region 107 of the device 100. The drain current of the native PMOS device 100 is primarily due to carriers flowing within the active region 107 in a channel region 106 located below the gate region 105 and between the source region 101 and the drain region 102.

The strained regions 170 and 175 can be formed to enhance performance of the native PMOS device 100 that can include enhancing the mobility of carriers in the channel 106 and as a result enhancing the drain current. The strained regions 170 and 175 can be formed with a material having a lattice structure that is dissimilar to the lattice structure of the substrate 155 material. The lattice structures of the materials of the strained regions 170 and 175 can be larger than the lattice structure of the substrate 155 material. The larger lattice structures of the materials in the strained regions 170 and 175 can push portions of the substrate region 155a adjacent to a first side 170a of the strained region 170 and a first side 175a of the strained region 175 towards the channel region 106. This can induce a uniaxial compressive strain in the channel region 106 which may result in higher mobility of the carriers in the substrate region 155a when compared to conventional native PMOS devices without strained regions in the source and drain regions. In one example of this embodiment, a compound semiconductor, such as silicon germanium (SiGe), having a larger lattice structure than that of the substrate 155 material such as Si can be used to form the strained regions 170 and 175 on the substrate 155. The lattice mismatch between the SiGe regions if formed on the Si substrate 155 can introduce strain in the strained regions 170 and 175.

In an example of this embodiment, the strained region 170 can be positioned in the substrate 155 in such a manner that a first side 170a of the strained region 170 can be substantially aligned vertically with a first side 105a of the gate region 105, and a second side 170b of the strained region 170 is adjacent to and/or in substantial contact with the inner perimeter side 135a of the STI region 135. The second strained region 175 can be positioned in the substrate 155 in such a manner that a first side 175a of the strained region 175 can be substantially aligned vertically with a second side 105b of the gate region 105, and a second side 175b of the strained region 175 is adjacent to and/or in substantial contact with the inner perimeter side 136a of the STI region 136.

The LDD regions 180 and 185 can be doped with p-type carriers using p-type materials, such as, but not limited to boron or aluminum. In an example of this embodiment, the LDD regions 180 and 185 can be approximately 100 nm in vertical dimensions and are typically referred to as shallow regions. The shallow LDD regions 180 and 185 can reduce an electric field under the gate region 105 and maintain a stable low threshold voltage over a wide range of channel lengths of the native PMOS device 100.

The LDD region 180 can be positioned in the substrate 155 in such a manner that a first portion of the LDD region 180 can be in the strained region 170 and a second portion of the LDD region 180 extends laterally out of the strained region 170. Similarly, the LDD region 185 can be positioned in the substrate 155 in such a manner that a first portion of the LDD region 185 can be in the strained region 175 and a second portion of the LDD region 185 extends laterally out of the strained region 175. The extended out portions of the LDD regions 180 and 185, can be positioned below the gate region 105 and be in substantial contact with different portions of the gate region 105, according to an example of this embodiment.

The HDD regions 190 and 195 can be formed by doping the substrate 155 with p-type carriers using p-type materials, such as, but not limited to boron or aluminum. The p-type carrier concentration in the HDD regions 190 and 195 can be higher than the p-type carrier concentrations of the LDD regions 180 and 185 for example. The HDD region 190 can be positioned in the strained region 170 in such a manner that a first side 190a and a second side 190b is adjacent to and/or in substantial contact with the LDD region 180 and a portion of the STI region 135, respectively. Similarly, the HDD region 195 can be positioned in the strained region 175 in such a manner that a first side 195a and a second side 195b is adjacent to and/or in substantial contact with the LDD region 185 and a portion of the STI region 126, respectively. Even though, the vertical dimensions of the HDD regions 190 and 195 are shown to be smaller than the vertical dimension of the strained regions, 170 and 175, in FIG. 1, the vertical dimensions of the HDD regions 190 and 195 and the strained regions 170 and 175 can be equal to each other in an example of this embodiment. The vertical dimensions of the HDD regions 190 and 195 can be larger than the vertical dimensions of the respective LDD regions, 180 and 185 in another example of this embodiment.

The gate region 105 of the native PMOS device 100 can be positioned between the source region 101 and the drain region 102 of the device 100. The lateral dimension between the first and second sides 105a and 105b of the gate region 105 is commonly referred to as the gate length. In an example of this embodiment, the gate region 105 includes a gate oxide layer 110, a metal layer 115, and a contact metal layer 120. The gate region 105 can be configured with equal lengths of the gate oxide layer 110, the metal layer 115, and the contact metal layer 120, where the length of each layer represents its respective lateral dimension between the first and second sides 105a and 105b of the gate region 105. The lateral dimension of the metal layer 115 can be greater than the lateral dimension of the contact metal layer 120, according to an example of this embodiment.

The contact metal layer 120 can be positioned above and in substantial contact with the metal layer 115. One or more materials having low contact resistances, such as, but not limited to aluminum or copper can be used for the fabrication of the contact metal layer 120. The contact metal layer 120 serves, for example, as a contact pad for the coupling of the native PMOS device 100 with other devices or peripheral circuitry. The metal layer 115 can represent a metal gate or a gate electrode of the native PMOS device 100. The metal layer 115 can be positioned between and in substantial contact with the contact metal layer 120 and the gate oxide layer 110. In one example of this embodiment, the metal layer 115 can be deposited at a thickness smaller than the thickness of the contact metal layer 120. The material used to form the metal layer 115 can be any metal with a work function comparable to P+ polysilicon. For example, but not limited to tungsten or titanium can be used to form the metal layer 115. The use of the metal gate layer can allow, low temperature processing of the device 100 using a CMOS logic foundry technology when compared to the processing temperature of the conventional native PMOS device. A conventional P+ polysilicon gate typically requires higher processing temperature due to annealing process than the metal gate processing temperature. Low temperature processing can help to reduce heat induced stress in the materials of the native PMOS device 100 that may result in variation of the characteristic of the device 100.

The gate oxide layer 110 can be positioned between and in substantial contact with the top side 155c of the substrate 155 and the metal layer 115. A high dielectric constant (high-k dielectric) gate oxide having a thickness approximately in a range between approximately 2 nm and approximately 5 nm can be used as the gate oxide layer 110. A high-k dielectric refers to an insulating material having a dielectric constant larger than $SiO_2$. The gate oxide layer 110 can be formed using at least a high-κ dielectric material having a dielectric constant between 10 and 30 such as, but not limited to, hafnium dioxide or zirconium dioxide to provide some examples. Capacitors formed with high-k materials are typically characterized with higher capacitance than capacitors with $SiO_2$. For instance, using the high-k gate oxide layer 110 in the native PMOS device 100 can provide a higher gate oxide capacitance, $C_{ox}$, between the metal gate 115 and the substrate 155a or the channel region 106 when compared to the gate oxide capacitance obtained for a similar gate oxide thickness in the conventional native PMOS device. Thus, for a similar gate oxide capacitance, thicker high-k gate oxide layer 110 can be used in the device 100 than the gate oxide in the conventional native PMOS. Thicker high-k gate oxide layer 110 can help to reduce leakage due to tunneling of carriers between the metal gate 115 and the substrate region 155a, in an example of this embodiment.

According to an example of this embodiment, applying a first potential, such as a negative voltage to the gate region 105 and a second potential, such as a ground potential to the HDD region 190 of the source region 101 can cause the p-type carriers below the gate region 105 to form a channel region 106 between the LDD region 180 of the source region 101 and the LDD region 185 of the drain region 102. When a third potential, such as a negative voltage is applied to the HDD 195 of the drain region, the p-type carriers accumulated in the channel region can allow a current to flow from the source region 101 to the drain region 102 of the native PMOS device 100. This current is typically referred to as the drain current. The drain current can be influenced, for example, by the mobility of p-type carriers in the channel region 106 and the gate capacitance, Cox, of the native PMOS device 100. Improving the mobility of p-type carriers in the channel region 106 and increasing the gate capacitance, Cox, can increase the drain current. For example, the drain current of the native PMOS device 100 is higher than the drain current of the conventional native PMOS device since the use of the strained regions 170 and 175 can improve the mobility of p-type carriers in the native PMOS device 100, and the use of high-k gate oxide can improves the gate oxide capacitance of the native PMOS device 100.

The native PMOS device 100 can include spacers 125 and 130 above the respective LDD regions 180 and 185 and in substantial contact with the respective first and second sides 105a and 105b of the gate region 105. The spacers 125 and 130 can be formed using a dielectric material, such as $SiO_2$, though any suitable insulating material can be used.

According to an embodiment, a voltage at the gate region 105 generates an electric field, which depletes the channel region 106 or a portion of the channel region 106 of free carriers. The region of the channel region 106 that is depleted of free carriers is referred to as the depletion region of the native PMOS device 100. If a negative voltage is applied to the gate region 105, for example, the depletion region can spread in the channel region 106 from the LDD and HDD regions 185 and 195 of the drain region 102 toward the LDD and HDD regions 180 and 190 of the source region 101. If the depletion region reaches the source region 101, then "punchthrough" can occur. For instance, the gate region 105 can no longer be able to control the drain current from the source region 101 to the drain region 102.

Halo implants 160 and 165 can be formed to prevent punchthrough in the native PMOS device 100. For example, the halo implants 160 and 165 can hinder the depletion region from reaching the HDD region 190 of the source region 101 when the depletion region extends through the channel region 106. The halo implants 160 and 165 can be doped with phosphorus atoms or arsenic atoms, to provide some examples. The halo implants 160 and 165 can be typically doped more heavily than the N-wells 145 and 146. Deep submicron PMOS devices often include halo implants 160 and 165 also referred to as "pockets".

Figure 2:
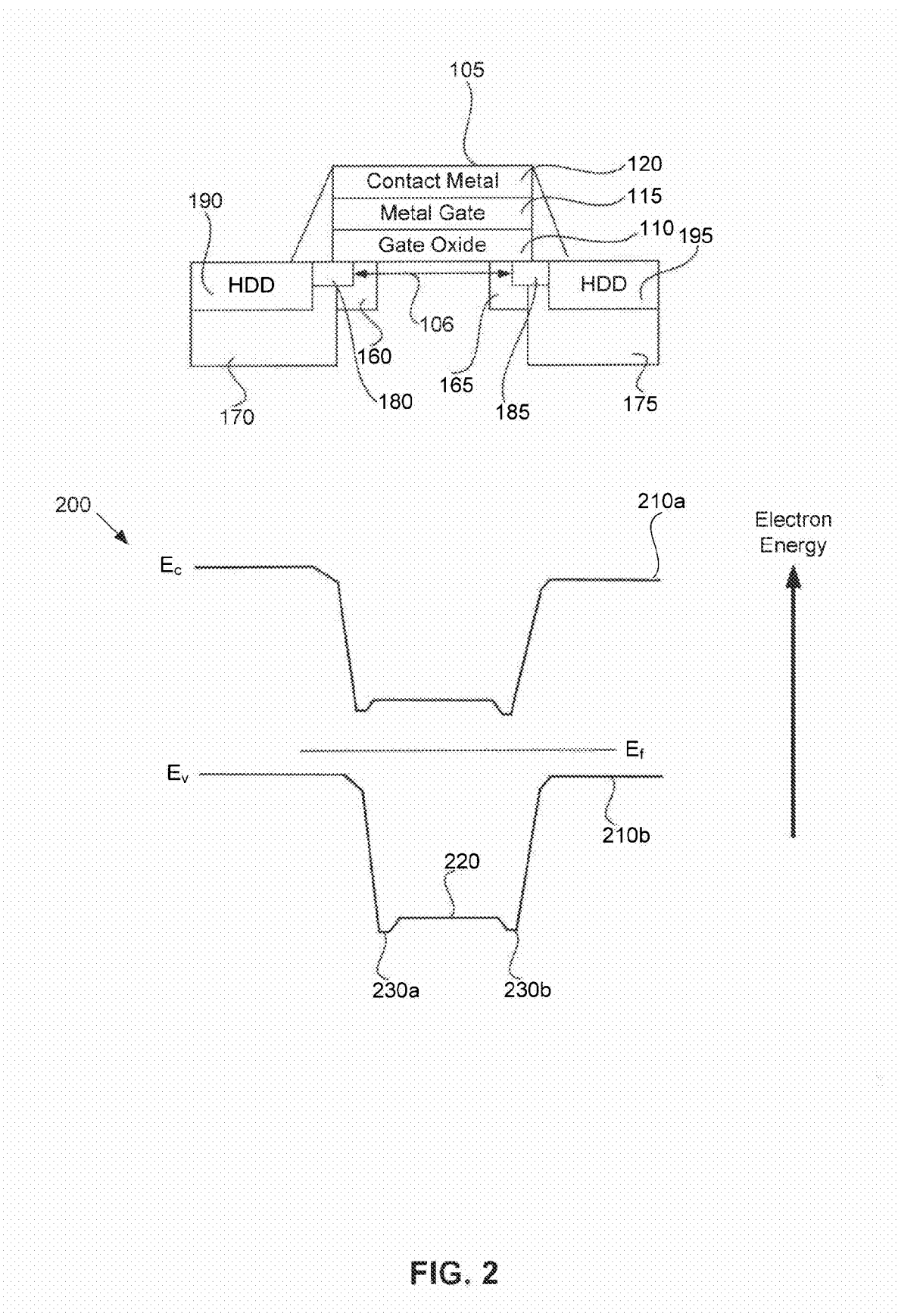
FIG. 2 illustrates a horizontal energy band diagram according to an embodiment of the present disclosure.

FIG. 2 illustrates a horizontal energy band diagram 200 according to an embodiment of the present disclosure. The horizontal energy band diagram 200 includes a conduction energy band ($E_C$) 210a and a valence energy band ($E_V$) 210b. The fermi energy level ($E_f$) is the energy level having approximately a fifty percent probability of being filled with a carrier at equilibrium. The energy band 210b is at a higher electron energy at point 220 as compared to points 230 because the halo implants 160 and 165 increase the barriers at points 230. A higher barrier generally allows fewer carriers to pass. For example, the halo implants 160 and 165 can reduce the leakage current between the source region 101 and the drain region 102.

Figure 3:
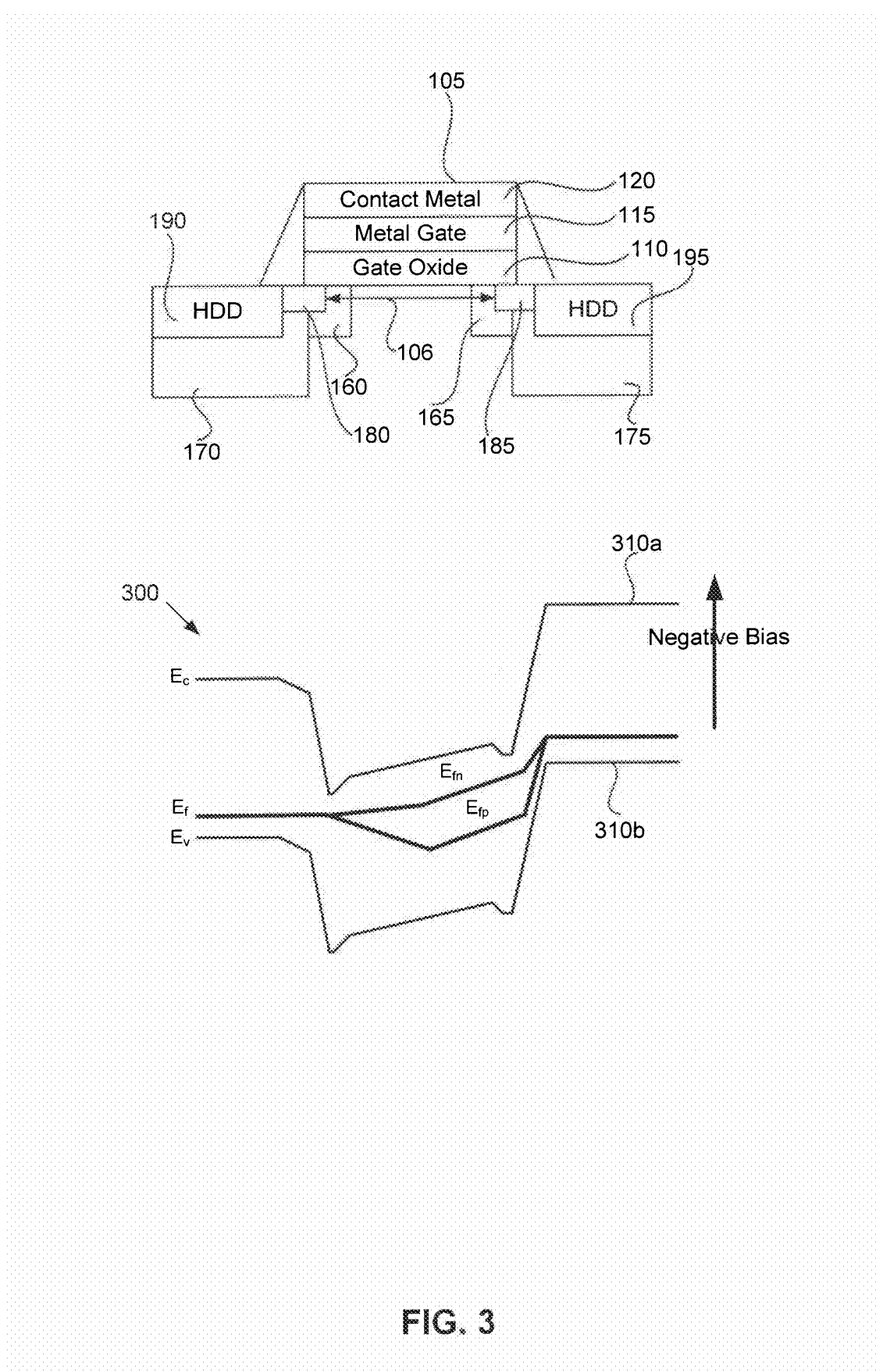
FIG. 3 illustrates a horizontal energy band diagram depicting punch-through according to an embodiment of the present disclosure.

FIG. 3 illustrates a horizontal energy band diagram 300 depicting punchthrough according to an embodiment of the present disclosure. In FIG. 3, the HDD region 190 of the source region 101 is biased to ground for illustrative purposes. The HDD region 195 of the drain region 102 is negatively biased, such that the depletion region 340 extends from the HDD region 190 of the source region 101 and touches the HDD region 195 of the drain region 102. The energy bands 310 can shift in response to the depletion region contacting the HDD region 190 of the source region 101, and as a result holes can be allowed to pass from the source region 101 to the drain region 102.

In a non-equilibrium condition, the fermi energy level $E_f$ differs for electrons and holes, resulting in an electron quasi-fermi level ($E_{fn}$) and a hole quasi-fermi level ($E_{fp}$). As shown in FIG. 3, negatively biasing the drain region can create a non-equilibrium condition, which shifts the energy bands $E_C$, $E_V$, and $E_f$ of the energy band diagram 300. The difference between $E_{fn}$ and $E_{fp}$ is directly proportional to the bias voltage (V) applied to the HDD region 195. This difference is represented by the equation $E_{fn} - E_{fp} = q_e V$, where $q_e$ is the charge of an electron.

Referring back to FIG. 1, in absence of punchthrough, the magnitude of the voltage at the gate region 105 may have to exceed a threshold voltage of the native PMOS device to allow carriers, such as holes or electrons, to flow from the source region 101 to the drain region 102, or vice versa. According to an embodiment, the native PMOS device 100 has a positive threshold voltage. For example, the threshold voltage can be approximately +300 mV to +500 mV. In this example, the native PMOS device 100 can turn on in response to the gate voltage going below approximately +300 mV to +500 mV.

Figure 4:
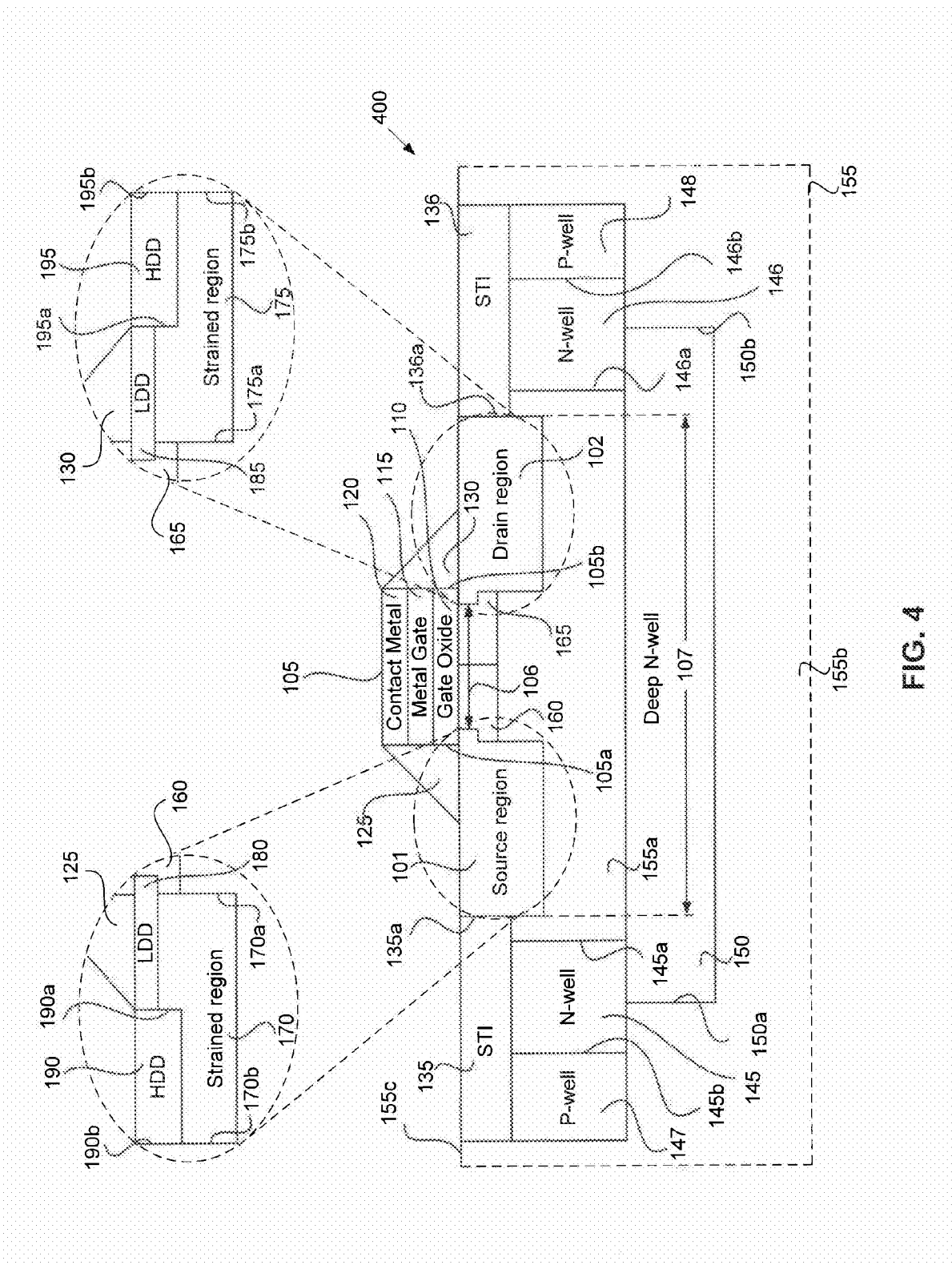
FIG. 4 illustrates a cross-sectional view of a short channel native PMOS device according to an embodiment of the present disclosure.

The threshold voltage is based on characteristics of the native PMOS device 100. For example, the distance between the halo implants 160 and 165 is generally directly proportional to the threshold voltage of the native PMOS device 100. Referring to the embodiment of FIG. 4, the halo implants 160 and 165 can touch each other. For instance, the halo implants 160 and 165 can combine to form a single halo implant. The combined halo implant can provide the same function as an N-well of a conventional PMOS device. In FIG. 4, the native PMOS device 400 can have a threshold voltage of approximately zero volts.

According to an embodiment, the channel length of the native PMOS device 100, 400 can affect the threshold voltage of the native PMOS device 100, 400. For example, a shorter channel length can necessitate that the halo implants 160 and 165 be closer together.

Figure 5:
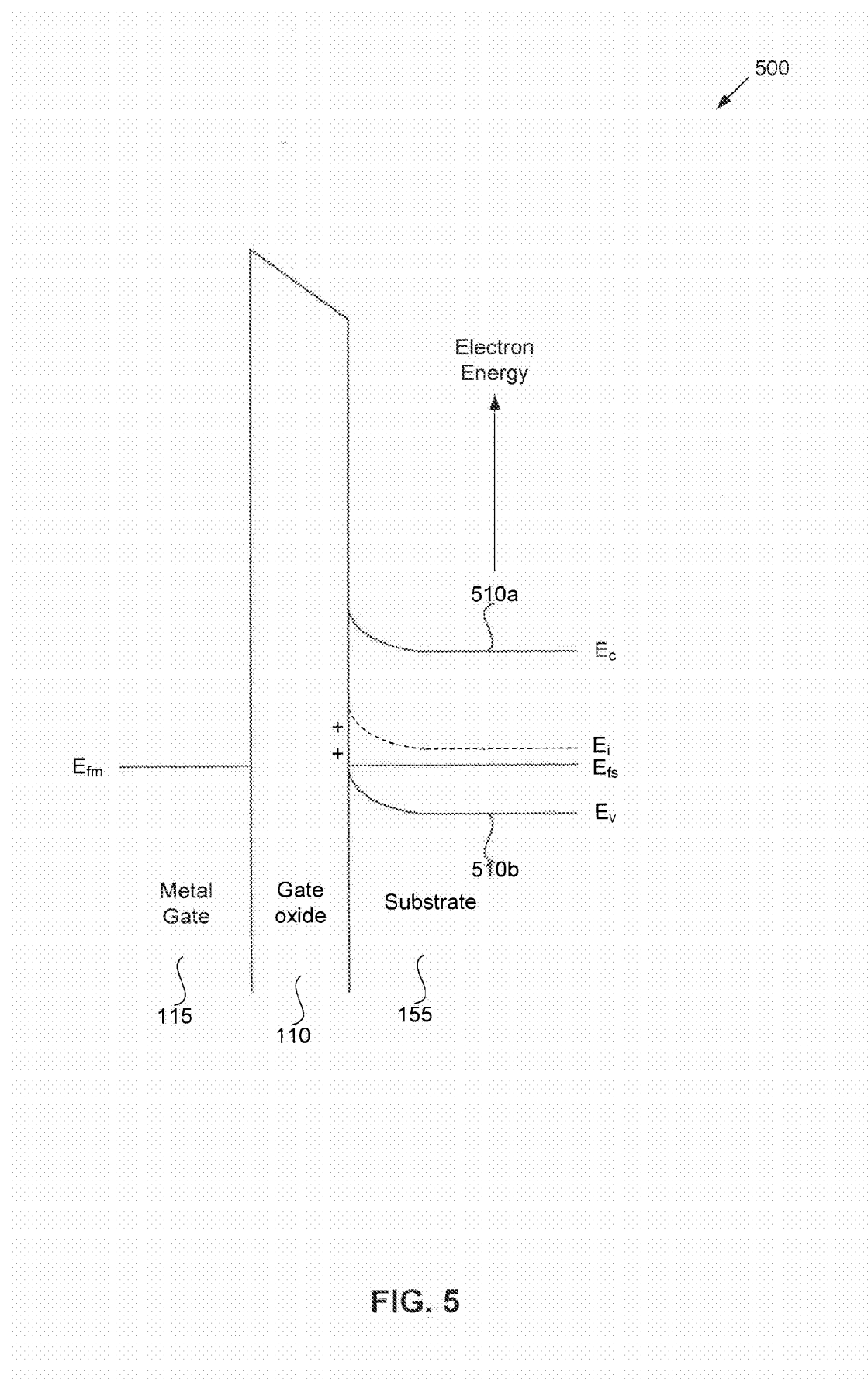
FIG. 5 illustrates a vertical energy band diagram according to an embodiment of the present disclosure.

Turning now to FIG. 5, a vertical energy band diagram 500 represents energy bands 510 of the gate region 105 and the substrate 155, for example a P-type substrate. In FIG. 5, the native PMOS device 100, 400 is at equilibrium. No voltage is applied at the gate region 105. The voltage at the gate region 105 is approximately zero. $E_C$ and $E_V$ represent the edges of the conduction band 510a and the valence band 510b, respectively. $E_i$ represents the intrinsic fermi level $E_{fm}$ and $E_{fs}$ represent the fermi levels in the metal gate and the substrate, respectively. In FIG. 5, the energy bands 510 of the substrate 155 bend in the direction of higher electron energy (i.e. lower electrostatic potential) at the junction between the gate oxide layer 110 and the P-substrate 155.

Figure 6:
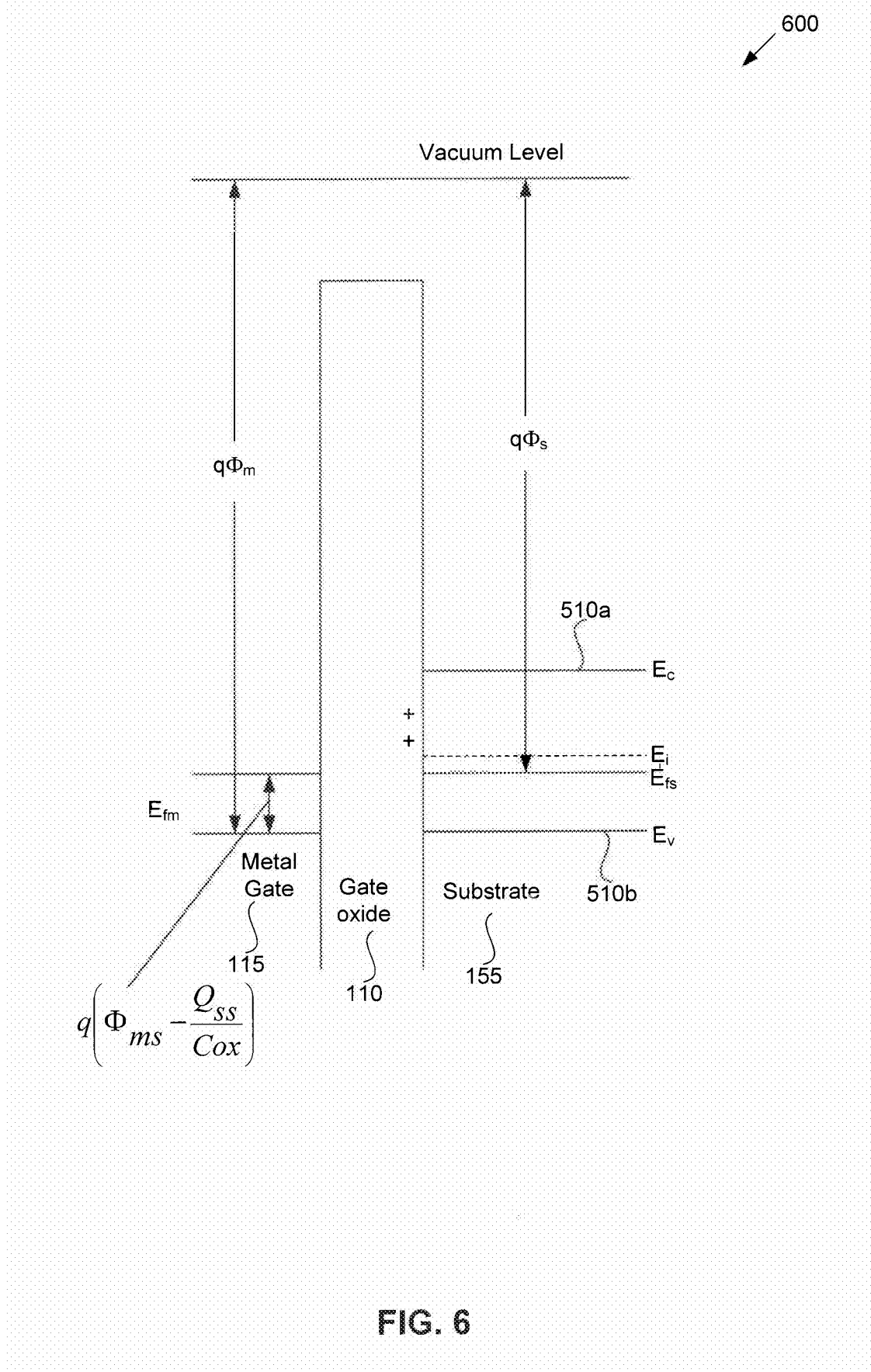
FIG. 6 illustrates a flat-band condition of a native PMOS device according to an embodiment of the present disclosure.

FIG. 6 illustrates a flatband condition of the native PMOS device 100, 400 according to an embodiment of the present disclosure. For instance, applying a negative voltage at the gate region 105 can flatten the energy bands 510, as shown in FIG. 6. According to an embodiment, a negative voltage at the gate region 105 can reduce the electron energy at the junction between the gate oxide layer 110 and the P-substrate 155.

The threshold voltage of a conventional PMOS device can be expressed by:

$$V_t = \Phi_{ms} - (Q_{SS}/C_{OX}) - (Q_B/C_{OX}) - 2\Phi_f, \quad (1)$$

where $\Phi_{ms} = \Phi_m - \Phi_s$. $\Phi_m$ is based on the type of material used for the gate region 105, and $\Phi_s$ is based on the type of material used for the substrate 155. For example, referring back to FIGS. 1 and 4, the gate region 105 is a metal, and the substrate 155 is P-type. $Q_{SS}$ represents the fixed charges in the gate oxide layer 110. $\Phi_{ms}$ and $Q_{SS}$ can be used to calculate the flat band voltage of the native PMOS device 100. $C_{OX}$ represents the capacitance between the gate region 105 and the P-type substrate 155. In FIG. 6, q represents the charge of an electron and equals approximately $1.602 \times 10^{-19}$ C.

$2\Phi_f$ represents the onset of inversion with respect to band bending. Inversion refers to the accumulation of charge at the surface of the substrate 155. For example, if charge is accumulated at the surface of the substrate 155, then the energy bands 510 typically bend upward or downward. If the energy bands 510 are flat, then charge is generally not accumulated at the surface of the substrate 155.

$Q_B$ represents the depletion charge contributed by the N-well 145 at the onset of inversion. Because the wells are N-type in this example, $Q_B$ is a positive (i.e. donor-type) charge.

If the native PMOS device 100, 400 includes halo implants 160 and 165 as shown in FIGS. 1 and 4, the threshold voltage is further based on the depletion charge $Q_h$ at the surface of the halo implants, 160 and 165. For example, charge can accumulate at the interface between halo implant 160 and the HDD region 190 and/or halo implant 165 and the HDD region 195. Taking $Q_h$ into consideration, the threshold voltage can be represented by as:

$$V_t = \Phi_{ms} - (Q_{SS}/C_{OX}) - (Q_B/C_{OX}) - 2\Phi_f - (Q_h/C_{OX}). \quad (2)$$

The native PMOS device 100, 400 can have N-wells 145 and 146 that do not extend completely across the active region 107. The material beneath the gate oxide layer 110 can be P-type substrate 155. Charge $Q_{psub}$ from the P-substrate 155 can contribute to the threshold voltage, as indicated by:

$$V_t = \Phi_{ms} - (Q_{SS}/C_{OX}) - (Q_B/C_{OX}) - 2\Phi_f - (Q_h/C_{OX}) + (Q_{psub}/C_{OX}). \quad (3)$$

Referring to FIG. 1 for illustrative purposes, the $Q_{psub}$ and $Q_B$ charges generally dominate the threshold voltage calculation for a native PMOS device 100 having a long channel region 106. The threshold voltage of a long channel device (e.g., a device having a channel length of approximately 1 μm or greater) is, therefore, typically positive. For instance, the threshold voltage of a long channel device can be approximately 300-500 mV. At the onset of inversion, most of the $Q_B$ charge is contributed by the deep N-well 150 because the N-wells 145 and 146 generally do not extend substantially into the active region.

Referring to FIG. 4, the $Q_h$ charge contributed by the halo implants 160 and 165 can have a more significant impact on the threshold voltage for a native PMOS device 400 that has a short channel region 106. For example, if the channel region length is reduced, then $Q_B$ and $C_{OX}$ decrease, but $Q_h$ remains substantially the same. $Q_B$ and $C_{OX}$ are both area-dependent. In the embodiments of FIGS. 1 and 4, $Q_B$ and $C_{OX}$ are dependent on the area under the gate region 105. As the area under the gate is reduced, $Q_B$ and $C_{OX}$ decrease proportionally. Thus, the ratio of $Q_B/C_{OX}$ does not vary substantially based on the channel region length of the native PMOS device 100, 400. As the channel region length is reduced, the ratio of $Q_h/C_{OX}$ increases, because $Q_h$ remains substantially the same. However, as the channel region length is reduced, the threshold voltage becomes less positive. In an embodiment, the native PMOS device 400 has a threshold voltage of approximately zero volts.

A Native PMOS According to a Second Embodiment of the Present Disclosure

A CMOS logic foundry technology fabricates the native PMOS device 700 in a similar manner as the native PMOS device 100 as described above. Therefore, only differences between the native PMOS device 700 and the native PMOS device 100 are to be described in further detail.

Figure 7:
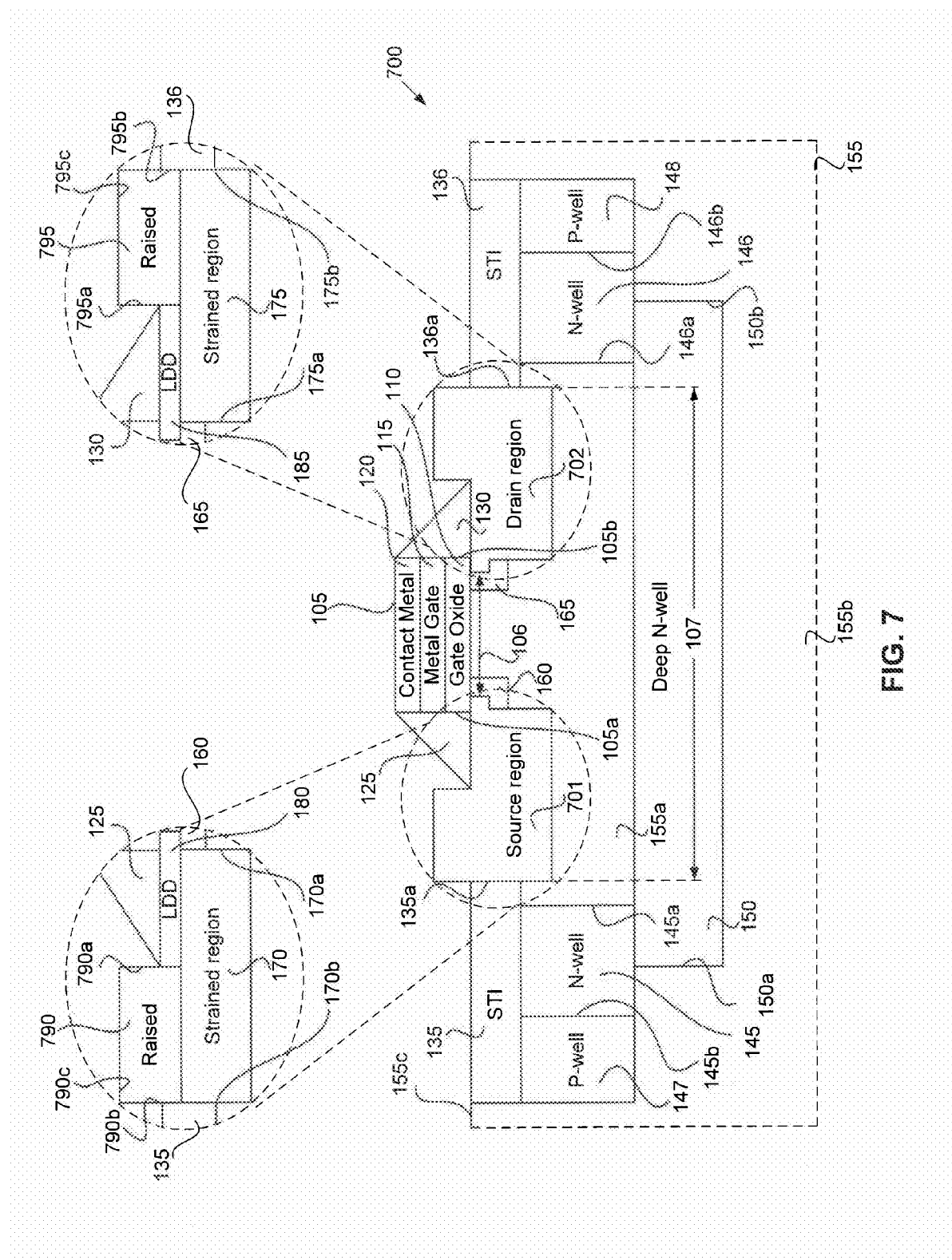
FIG. 7 illustrates a cross-sectional view of a native PMOS device according to a second embodiment of the present disclosure.

As shown in FIG. 7, the source region 701 of the native PMOS device 700 can be formed to include an LDD region 180, a raised region 790, and the strained region 170, and the drain region 702 can be formed to include an LDD region 185, a raised region 795, and the strained region 175.

In an example of this embodiment, the LDD region 180 can be positioned in the substrate 155 in such a manner that a first portion of the LDD region 180 is in the strained region 170 and a second portion of the LDD region 180 extends laterally out of the strained region 170. Similarly, the LDD region 185 can be positioned in the substrate 155 in such a manner that a first portion of the LDD region 185 is in the strained region 175 and a second portion of the LDD region 185 extends laterally out of the strained region 175. The extended out portions of the LDD regions 180 and 185 can be positioned below the gate region 105 and be in substantial contact with different portions of the gate region 105. The LDD regions 180 and 185 can be doped with p-type carriers using p-type materials, such as, but not limited to boron or aluminum. In an example of this embodiment, the LDD regions 180 and 185 can be approximately 100 nm in vertical dimensions.

According to an example of this embodiment, the raised regions 790 and 795 can be formed from the same material as the substrate 155 material. The raised regions 790 and 795 can be doped heavily with p-type material, such as, but not limited to boron or aluminum. The p-type carrier concentration in the raised regions 790 and 795 can be higher than the p-type carrier concentrations of the LDD regions, 180 and 185, according to an example. A first portion of the raised region 790 can be positioned in the strained region 170 and a second portion of the raised region 790 can extend out vertically from the strained region 170, such that a top side 790c of the raised region 790 can be at a higher elevation than the top side 155c of the substrate 155. The first portion of the raised region can be located between the LDD region 180 and the inner perimeter side 135a of the STI region 135. Similarly, a first portion of the raised region 795 can be positioned in the strained region 175 and a second portion extends out vertically from the strained region 175, such that a top side 795c of the raised region 795 can be at a higher elevation than the top side 155c of the substrate 155. The first portion of the raised region can be located between the LDD region 185 and the inner perimeter side 136a of the STI region 136. The vertical dimensions of the extended portions of the raised regions 790 and 795 are for example, approximately half of the vertical dimension of the gate region 105. The vertical dimensions of the first portions of the raised regions 790 and 795 can be equal to or less than the vertical dimensions of the respective LDD regions 180 and 185.

Deep junctions (e.g., approximately 200 nm or greater or comparable to channel region length 106) formed between the source region 701 and the substrate region 155a, and the drain region 702 and the substrate region 155a can increase the likelihood that the threshold voltage varies across a range of channel region 106 lengths. Deep junctions can increase the likelihood of the source depletion region and the drain depletion region overlap which may result in the loss of gate control over the threshold voltage. According to an embodiment, shallow junction depths (e.g., approximately 50-100 nm) can provide a threshold voltage that is relatively constant over a range of channel region 106 lengths. The raised regions 790 and 795 can help to reduce the depth of the junction between the source region 701 and the substrate region 155a, and between the drain region 702 and the substrate region 155a. For example, the vertical dimensions of the first portions of the raised regions 790 and 795 can be equal to or less than the shallow LDD regions 180 and 185 which can be approximately 100 nm. Shallow junctions provided by the first portions of the raised regions 790 and 795 can reduce the possibility of the source depletion region and the drain depletion region overlap and as a result may reduce the possibility of punchthrough. In an example of this embodiment, the native PMOS device 700 can be fabricated without the halo implants 160 and 165 since the raised regions 790 and 795 can help to prevent punchthrough.

According of an example of this embodiment, shallow first portions of the raised regions 790 and 795 in the respective source region 701 and drain region 702 can help to improve the drain current of the native PMOS device 700 by providing lower resistance (also referred herein as drain resistance) to the flow of carriers between the source region 701 and the drain region through the channel region 106 than the resistance provided by the HDD regions 190 and 195 in the source and drain regions of the native PMOS device 100. In another example, the drain resistance of the native PMOS device 700 is lower than the drain resistance provided by the P+ regions in the source and drain regions of the conventional native PMOS device.

Figure 8:
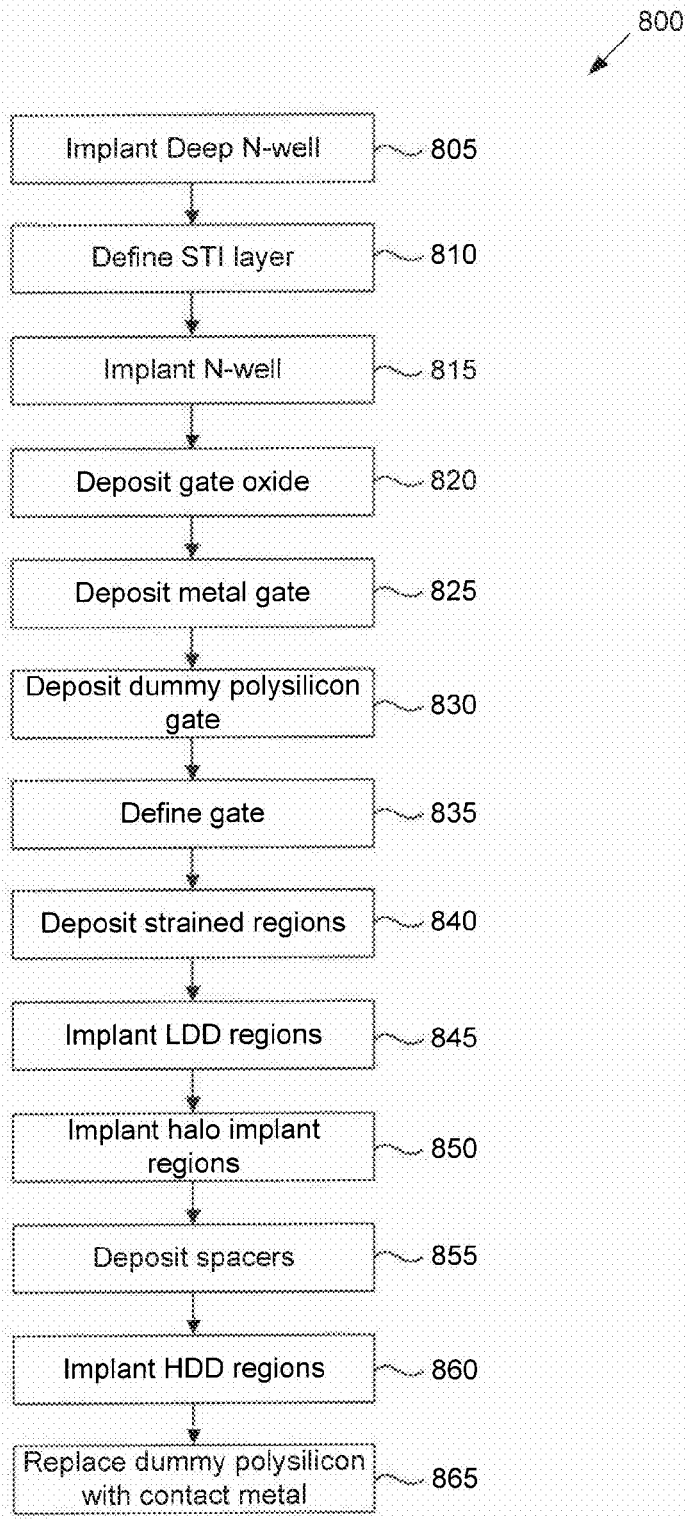
FIG. 8 illustrates a flow chart for a method of processing a native PMOS device according to a first embodiment of the present disclosure.

A Method of Processing a Native PMOS According to a First Embodiment of the Present Disclosure FIG. 8 illustrates a flow chart for a method of processing a native PMOS device according to a first embodiment of the present disclosure. The native PMOS device 100, 400 can be fabricated using, for example, CMOS logic foundry technology with a minimum design rule of 28 nm. A deep N-well 150 is implanted in the substrate 155 at block 805. For example, a region in the substrate 155 can be doped by using an ion implantation process to accelerate phosphorus or arsenic atoms into the substrate 155 to form the deep N-well. A shallow trench isolation (STI) layer is defined at block 810. For instance, the STI regions 135 and 136 can be etched to provide an opening for the isolation of active PMOS elements.

The N-wells 145 and 146 are implanted at block 815. Photoresist is generally placed over the substrate 155 and portions of the STI layer 135, though the scope of the disclosure is not limited in this respect. A mask is used to block light (e.g., ultraviolet light typically used in photolithography) from portions of the photoresist and to expose those portions that are not blocked by the mask. For a positive photoresist process, the exposed portions of the photoresist are removed by chemical etching, for example. For a negative photoresist process, the portions of the photoresist that are not exposed are removed. Phosphorus or arsenic atoms are implanted into the substrate 155 in those areas not covered by photoresist to provide the N-wells 145 and 146. The remaining photoresist is then removed. The N-wells 145 and 146 can be in substantial contact with the deep N-well 150. For instance, the entire perimeter of the deep N-well 150 can extend beyond the inner perimeter sides 145a and 146a of the N-wells 145 and 146.

The gate oxide layer 110 is deposited at block 820 over the entire top side 155c of the substrate 155. For example, the gate oxide 110 can be deposited by atomic layer deposition or chemical vapor deposition. At block 825, the metal layer 115 is deposited over the gate oxide layer 110, for example, by an evaporation process of metal targets or atomic layer deposition. At block 830, a dummy polysilicon is deposited over the metal layer 115, for example, by a chemical vapor deposition process. The dummy polysilicon can be replaced by the contact metal layer 120 at the end of the processing of the native PMOS device 100, 400. This partial replacement of the gate region 105 can help to protect, the integrity of the contact metal layer which can be intolerant to the temperatures used in the processing. The gate region 105 with the dummy polysilicon is defined at block 835. Photoresist is generally deposited on the dummy polysilicon layer. The photoresist is masked and exposed, and either exposed or unexposed portions of the photoresist are removed depending on the type of photoresist used. The dummy polysilicon layer, the metal layer 115, and gate oxide layer 110 is typically etched in the regions where the photoresist is removed to define the gate length of the native PMOS device 100, 400. The remaining photoresist is removed after the gate region 105 is formed.

At block 840, epitaxial layers of strained SiGe are deposited in the strained regions 170 and 175 of the device 100, 400. For instance, the strained regions, 170 and 175, are first defined and etched using mask and photoresist. Epitaxial layers of Si are deposited in the etched regions with Ge atoms introduced during the epitaxial growth. The P-type LDD regions 180 and 185 are implanted at block 845. For example, the substrate region 155a in the strained regions 170 and 175 can be doped with boron atoms using an ion implantation process to provide the respective P-type LDD regions 180 and 185. The halo implants 160 and 165 are implanted at block 850. The halo implants 160 and 165 are implanted at a 45 degree angle into the substrate region 155a to form the halo implants at a deeper region under the gate region 105 than the LDD regions, 160 and 165, as shown in FIGS. 1 and 4. The spacers, 125 and 130, are deposited at block 855. The spacers, 125 and 130, are typically dielectric material, formed of some type of nitride, such as Si3N4, or an oxide, such as SiO2. The spacers, 125 and 130, can be deposited using low-pressure chemical vapor deposition, for instance. Alternatively, block 840 can be processed after the formation of spacers at block 855.

The HDD regions 190 and 195 are implanted at block 860, for example, by an ion implantation process. For example, boron atoms can be accelerated into the strained regions 170 and 175 to form the heavily implanted HDD regions 190 and 195 respectively. At block 865, the dummy polysilicon of the gate region 105 is etched off and the contact metal layer 120 is deposited on the metal layer 115 of the gate region 105.

The above processing steps are provided by way of example and not limitation. Persons having ordinary skill in the semiconductor processing art will readily envision alternative processing techniques to achieve the same device based on the present disclosure.

A Method of Processing a Native PMOS According to a Second Embodiment of the Present Disclosure FIG. 9 illustrates a flow chart for a method of processing a native PMOS device according to a second embodiment of the present disclosure. The native PMOS device 700 can be fabricated using, for example, CMOS logic foundry technology with a minimum design rule of 20 nm. The processing of the native PMOS device 700 is similar to the processing of the device 100, 400 as described above. Therefore, only differences between the processing steps of the native PMOS device 700 and the native PMOS device 100 are to be described in further detail.

As shown in FIG. 9, a dummy polysilicon is deposited at block 920 as a dummy gate. The dummy gate can be replaced at the end of the processing of the native PMOS device 700 with the gate region 105 of the native PMOS device 700.

At block 950, the raised regions 790 and 795 are formed, for example, by depositing epitaxial layers of Si. The raised regions 790 and 795 are heavily doped with p-type carriers, for example, by ion implantation of the deposited Si epitaxial layers or by in situ doping, i.e., doping with p-type material during the deposition of the Si epitaxial layers. Block 950 can be combined with the deposition of strained SiGe layers at block 930 and the combined process can follow the formation of spacers at block 945.

At block 955, the dummy gate between the spacers 125 and 130 of the device 700 is etched off. The gate oxide 110 is deposited at block 960, the metal layer 115 is deposited at block 965 and the contact metal layer is deposited at block 960.

The above processing steps are provided by way of example and not limitation. Persons having ordinary skill in the semiconductor processing art will readily envision alternative processing techniques to achieve the same device based on the present disclosure.

Different Exemplary Configurations of a Native PMOS According to an Embodiment of the Present Disclosure FIGS. 10-12 show different exemplary configurations of a native PMOS device according to embodiments of the present disclosure. For example, the configuration shown in FIG. 10-12 can correspond to the cross-sectional view of the native PMOS device 100, 400, 700 shown in FIG. 1, FIG. 4 or FIG. 7, respectively. In FIGS. 10-12, the N-well 1045 has an inner perimeter 1010 and an outer perimeter 1020. Referring to FIG. 10, the active area 107 does not overlap the N-well 1045. The inner perimeter 1010 completely laterally surrounds the active area 107 in the two-dimensional representation of FIG. 10. For instance, providing the active area 107 within the inner perimeter 1010 of the native PMOS device 100, 400, 700 can reduce the junction capacitance of the native PMOS device 100, 400, 700. Referring to FIG. 1, for instance, N-well 145 does not extend beneath the source region 101 and N-well 146 does not extend beneath the drain region 102.

In FIG. 11, the active region 107 overlaps the N-well 1045 near the metal gate endcaps 1120a and 1120b, as indicated by the shaded overlapping regions 1110a and 1110b. For instance, overlapping the N-well 1045 and the active region 107 near the metal gate endcaps 1110a and 1120b can reduce the source-to-drain leakage current.

In FIG. 12, the active region 107 overlaps, the N-well 1045 at all edges of the active region 107, as indicated by the shaded overlapping region 1210. For example, overlapping the N-well 1045 and the active region 107 at all edges of the active region 107 can substantially reduce the leakage path between the source and drain regions of the native PMOS device 100, 400, 700.

CONCLUSIONS

It is to be appreciated that the Detailed Description section, and not the Abstract section, is intended to be used to interpret the claims. The Abstract section can set forth one or more, but not all exemplary embodiments, of the present disclosure, and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the present disclosure. Thus, the present disclosure should not be limited by any of the above-described exemplary embodiments, but should be defined only in accordance with the following claims and their equivalents.

What is claimed is:

1. A P-type metal-oxide semiconductor (PMOS) device, comprising:
   a substrate having a first material and a first type conductivity different from a second type conductivity;
   a deep well region, having the second type conductivity, dividing the substrate into a first substrate region having the second type conductivity and a second substrate region having the first type conductivity;
   a source region having a second material configured to provide a first strained region in the first substrate region;
   a drain region having the second material configured to provide a second strained region in the first substrate region; and
   a gate region between the source region and the drain region, the gate region comprising:
      a first layer having a first thickness;
      a second layer having a second thickness, the second thickness being greater than the first thickness; and
      a third layer having a third thickness, the third thickness being greater than the second thickness.

2. The PMOS device of claim 1, wherein the source region further comprises:
   a first lightly doped region having a first doping concentration of carriers, and
   a first heavily doped region having a second doping concentration of the carriers; and
   wherein the drain region further comprises:
      a second lightly doped region having the first doping concentration of the carriers; and
      a second heavily doped region having the second doping concentration of the carriers, the second doping concentration being greater than the first doping concentration.

3. The PMOS device of claim 2, wherein a first portion of the first lightly doped region is positioned in the first strained region;
   wherein a second portion of the first lightly doped region is in contact with the gate region;
   wherein a first portion of the second lightly doped region is positioned in the second strained region; and
   wherein a second portion of the second lightly doped region is in contact with the gate region.

4. The PMOS device of claim 2, wherein the first heavily doped region is positioned in the first strained region and between the first lightly doped region and a shallow trench isolation (STI) region; and
   wherein the second heavily doped region is positioned in the second strained region and between the second lightly doped region and the STI region.

5. The PMOS device of claim 2, wherein vertical dimensions of the first and second strained regions are greater than or equal to vertical dimensions of the first and second heavily doped regions.

6. The PMOS device of claim 1, wherein a portion of the first strained region is aligned vertically with a portion of the gate region;
   wherein a second portion of the first strained region is in contact with a portion of an inner perimeter side of a shallow trench isolation (STI) region;
   wherein a portion of the second strained region is aligned vertically with a second portion of the gate region; and
   wherein a second portion of the second strained region is in contact with a second portion of the inner perimeter side of the STI region.

7. The PMOS device of claim 1, wherein the second material comprises a compound semiconductor material.

8. The PMOS device of claim 7, wherein the compound semiconductor material comprises a silicon germanium material.

9. The PMOS device of claim 1, wherein the first, second, and third layers form stacked layers; and
   wherein the first, second, and third layers have approximately equal lateral dimensions.

10. The PMOS device of claim 1, further comprising:
    a first halo implant region in contact with a portion of a first vertical side of the first strained region; and
    a second halo implant region in contact with a portion of a second vertical side of the second strained region.

11. The PMOS device of claim 1, wherein the PMOS device is characterized as having a threshold voltage of approximately zero volts.

12. A P-type metal-oxide semiconductor (PMOS) device, comprising:
    a substrate having a first material;
    a source region having a second material configured to provide a first strained region;
    a drain region having the second material configured to provide a second strained region; and
    a gate region between the source region and the drain region, the gate region comprising:
       a first layer having a first thickness,
          wherein the first layer is configured to be a high-k gate region oxide layer having a high-k dielectric material selected from the group consisting of: hafnium dioxide and zirconium dioxide;
       a second layer having a second thickness, the second thickness being greater than the first thickness,
          wherein the second layer is configured to be a metal layer having a metal selected from the group consisting of: tungsten and titanium; and
       a third layer having a third thickness, the third thickness being greater than the second thickness,
          wherein the third layer is configured to be a contact metal layer having a contact metal selected from the group consisting of: aluminum and copper.

13. A P-type metal oxide semiconductor (PMOS) device, comprising:
    a substrate having a first material and a first type conductivity different from a second type conductivity;
    a deep well region, having the second type conductivity, dividing the substrate into a first substrate region having the second type conductivity and a second substrate region having the first type conductivity;
    a source region having a first raised region in the first substrate region, a top side of the first raised region being raised above a top side of the first substrate region;
    a drain region having a second raised region in the first substrate region, a top side of the second raised region being raised above the top side of the first substrate region; and
    a gate region between the source region and drain region, the gate region comprising:
       a first layer having a first thickness;
       a second layer having a second thickness, the second thickness being greater than the first thickness; and
       a third layer having a third thickness, the third thickness being greater than the second thickness.

14. The PMOS device of claim 13, wherein the source region further comprises:

a first strained region having a second material, and
a first lightly doped region positioned in the first strained region, the first lightly doped region being in contact with a portion of the gate region; and
wherein the drain region further comprises:
a second strained region having the second material;
a second lightly doped region positioned in the second strained region, the second lightly doped region being in contact with a second portion of the gate region.

15. The PMOS device of claim 14, wherein a portion of the first strained region is aligned vertically with a portion of the gate region;
wherein a second portion of the first strained region is in contact with a portion of an inner perimeter side of a shallow trench isolation (STI) region;
wherein a portion of the second strained region is aligned vertically with a second portion of the gate region; and
wherein a second portion of the second strained region is in contact with a second portion of the inner perimeter side of the STI region.

16. The PMOS device of claim 14, wherein the second material comprises a compound semiconductor material.

17. The PMOS device of claim 16, wherein the compound semiconductor material comprises a silicon germanium material.

18. The PMOS device of claim 13, wherein the first raised region comprises:
a first portion positioned in the first strained region and between the first lightly doped region and a shallow trench isolation (STI) region, and
a second portion extending vertically out of the first strained region; and
wherein the second raised region comprises:
a first portion positioned in the second strained region and between the second lightly doped region and the STI region; and
a second portion extending vertically out of the second strained region.

19. The PMOS device of claim 18, wherein vertical dimensions of the second portions of the respective first and second raised regions are approximately half of a vertical dimension of the gate region.

20. The PMOS device of claim 13, wherein the first, second, and third layers form stacked layers; and
wherein the first, second, and third layers have approximately equal lateral dimensions.

21. The PMOS device of claim 13, wherein the PMOS device is characterized as having a threshold voltage of approximately zero volts.

22. The PMOS device of claim 13, wherein the top side of the first raised region is raised above a top side of a shallow trench isolation (STI) region; and
wherein the top side of the second raised region is raised above the top side of the STI region.

23. A P-type metal oxide semiconductor (PMOS) device, comprising:
a substrate having a first material;
a source region having a first raised region, a top side of the first raised region being raised above a top side of the substrate; a drain region having a second raised region, a top side of the second raised region being raised above the top side of the substrate; and
a gate region between the source region and drain region, the gate region comprising:
a first layer having a first thickness,
wherein the first layer is configured to be a high-k gate region oxide layer having a high-k dielectric material selected from the group consisting of: hafnium dioxide and zirconium dioxide;
a second layer having a second thickness, the second thickness being greater than the first thickness,
wherein the second layer is configured to be a metal layer having a metal selected from the group consisting of: tungsten and titanium; and
a third layer having a third thickness, the third thickness being greater than the second thickness,
wherein the third layer is configured to be a contact metal layer having a contact metal selected from the group consisting of: aluminum and copper.

* * * * *